(12) United States Patent
Du

(10) Patent No.: US 12,183,813 B2
(45) Date of Patent: Dec. 31, 2024

(54) CELL STRUCTURE AND SEMICONDUCTOR DEVICE USING SAME

(71) Applicant: NANJING SINNOPOWER TECHNOLOGY CO., LTD., Jiangsu (CN)

(72) Inventor: Wenfang Du, Jiangsu (CN)

(73) Assignee: NANJING SINNOPOWER TECHNOLOGY CO., LTD., Jiangsu (CN)

( * ) Notice: Subject to any disclaimer, the term of this patent is extended or adjusted under 35 U.S.C. 154(b) by 358 days.

(21) Appl. No.: 17/621,970

(22) PCT Filed: Aug. 28, 2019

(86) PCT No.: PCT/CN2019/103092
§ 371 (c)(1),
(2) Date: Dec. 22, 2021

(87) PCT Pub. No.: WO2020/258496
PCT Pub. Date: Dec. 30, 2020

(65) Prior Publication Data
US 2022/0246748 A1      Aug. 4, 2022

(30) Foreign Application Priority Data

Jun. 27, 2019   (CN) .......................... 201910566322.5

(51) Int. Cl.
*H01L 29/739* (2006.01)
*H01L 29/06* (2006.01)
*H01L 29/10* (2006.01)

(52) U.S. Cl.
CPC ...... *H01L 29/7397* (2013.01); *H01L 29/0607* (2013.01); *H01L 29/10* (2013.01)

(58) Field of Classification Search
None
See application file for complete search history.

(56) References Cited

U.S. PATENT DOCUMENTS

2015/0021684 A1    1/2015  Lee et al.
2015/0270375 A1*   9/2015  Darwish ............... H01L 29/408
                                                       438/270

(Continued)

FOREIGN PATENT DOCUMENTS

CN        107994071 A      5/2018
CN        109427869 A      3/2019
CN        108735823 B      6/2020

*Primary Examiner* — Khaja Ahmad
(74) *Attorney, Agent, or Firm* — Vincent J. Allen; James H. Ortega; Carstens, Allen & Gourley, LLP

(57) ABSTRACT

A cell structure and a semiconductor device using the same. The cell structure comprises a semiconductor substrate; a plurality of slot units are provided at the top end of the semiconductor substrate; a corresponding carrier barrier region is provided at the bottom of each slot unit; a conductive material is provided in each slot; source body regions are provided between the adjacent slot units; one or more source regions are closely attached on the surface of each source body region, and the source regions and the source body regions are in contact with a first metal layer at the top of the semiconductor substrate; a first semiconductor region and a second metal layer in contact with the first semiconductor region are provided at the bottom of the semiconductor substrate.

13 Claims, 6 Drawing Sheets

(56) References Cited

U.S. PATENT DOCUMENTS

| | | | |
|---|---|---|---|
| 2016/0359029 A1* | 12/2016 | Zeng | H01L 29/4236 |
| 2017/0025522 A1* | 1/2017 | Naito | H01L 29/407 |
| 2017/0243745 A1* | 8/2017 | Yilmaz | H01L 29/0619 |
| 2019/0312134 A1* | 10/2019 | Ikura | H01L 29/0696 |
| 2019/0371889 A1* | 12/2019 | Narita | H01L 29/66734 |
| 2020/0303507 A1* | 9/2020 | Yilmaz | H01L 29/4236 |

* cited by examiner

CELL STRUCTURE AND SEMICONDUCTOR DEVICE USING SAME

CROSS-REFERENCE TO RELATED APPLICATIONS

This application is a US 371 application from PCT/CN2019/103092 filed Aug. 28, 2019, and published as WO 2020/258496 A1 on Dec. 30, 2020, which claims priority to Chinese Application No. 201910566322.5 filed Jun. 27, 2019. Each application, publication and patent listed in this paragraph is hereby incorporated herein by reference in its entirety.

BACKGROUND

Technical Field

The present invention relates to the technical field of semiconductors, in particular to a cell structure and its related semiconductor device.

Related Art

Trench-type power semiconductor devices have many features such as high integration level, high input impedance, low driving power, simple driving circuit, low on-resistance, low on-state voltage drop, high switching speed, low switching loss, etc., and the trench-type power semiconductor devices are widely applied in various power management and switching applications. For example, common Trench Insulated Gate Bipolar Transistors (IGBTs), which are compound fully-controlled voltage driven power semiconductor devices composed of an Metal Oxide Semiconductor Field Effect Transistor (MOS) and a Bipolar Junction Transistor (BJT), have the above-mentioned features. In order to further improve the robustness and current density of such devices, a novel power semiconductor device, MOS Controlled Quasi-Thyristor (MCKT), which uses shallow trenches and deep trenches in combination, is proposed.

Technical Problem

In the manufacturing process of the power semiconductor devices using deep trenches and shallow trenches in combination, the doping concentrations and doping levels of the semiconductor materials in various parts should be adjusted strictly to effectively control the performance of the devices. Therefore, the process requirements are relatively rigorous. Especially, the depth of each trench, width of trench opening, and arrangement spacing of the trenches are particular, depending on the function of the device. Once minor errors occur, it may cause the function of the device different from the designed function; in addition, it is not easy to miniaturize the device if too many trenches are designed. Moreover, one intention of the original deep trench is to cooperate with the minority carrier barrier region, so as to confine the holes to flow out of the device from the P-type source region. If the etching window of the trench is misregistered, the doping concentration of the semiconductor region on one side near the deep trench will deviate from the predetermined requirement, resulting in an incorrect structure cooperating with the deep trench, thereby resulting in a poor conduction path or an unexpected hole channel, which cause a severely increased on-state voltage drop of the device.

SUMMARY OF ILLUSTRATIVE EMBODIMENTS OF THE INVENTION

In order to solve the above-mentioned technical problems, an object of the present application is to provide a cell structure and a semiconductor device using the cell structure, and improve the fault tolerance of the trench manufacturing process by improving the cell structure.

The object of the present application is attained and the technical problem of the present application is solved by using the following technical solution.

A cell structure of a semiconductor device proposed in the present application, characterized in that the cell structure comprises: a semiconductor substrate of a first conductivity type; a plurality of first trench units arranged at the top of the semiconductor substrate, the plurality of first trench units are spaced apart, a conductive material is arranged in the plurality of first trench units, and the conductive material is isolated from the semiconductor substrate by a first dielectric material; a carrier barrier region of a first conductivity type arranged to abut the bottoms of the bottoms of the plurality of first trench units or adjacent to the side edges of the bottoms of the plurality of first trench units and isolated from the conductive material by the first dielectric material; a first source-body region of a second conductivity type arranged in the gaps among the plurality of first trench units, with more than one source region arranged in the first source-body region, wherein the first source-body region and the source regions are located on the surface of the semiconductor substrate; a first metal layer arranged at the top of the semiconductor substrate, the first metal layer is in contact with the first source-body region and the source regions; a second dielectric material arranged at the top of the semiconductor substrate, adjacent to or abutting the first metal layer, the second dielectric material covers some or all trench openings of the plurality of first trench units; a first semiconductor region arranged at the bottom of the semiconductor substrate; and a second metal layer arranged to be in contact with the first semiconductor region.

The present application can also utilize the following technical measures to further solve its technical problem.

In an example of the present application, the number of the carrier barrier region is one, and the plurality of first trench units are in contact with the carrier barrier region together.

In an example of the present application, a plurality of carrier barrier regions are provided, and each of the plurality of first trench units contacts with a corresponding carrier barrier region among the plurality of carrier barrier regions.

In an example of the present application, the widths of the trench openings of the plurality of first trench units are identical to or different from each other.

In an example of the present application, the depths of the plurality of first trench units are equal to or different from each other.

In an example of the present application, a side edge of the first source-body region contacts the side edge of an adjacent first trench unit, and the source regions contact with the first dielectric material.

In an example of the present application, the second dielectric material abuts the first metal layer, covers all the trench openings of the plurality of first trench units, and contacts some or all of the source regions.

In an example of the present application, the conductivity type of the source regions is identical to the conductivity type of the semiconductor substrate.

In an example of the present application, the conductive material may be connected with the gate electrode of the semiconductor device to form a gate region, or may be designed for grounding.

In an example of the present application, the source regions are heavily doped regions or lightly doped regions.

In an example of the present application, the first conductivity type is N-type, and the second conductivity type is P-type; alternatively, the first conductivity type is P-type, and the second conductivity type is N-type.

In an example of the present application, the first semiconductor region is of a first conductivity type or a second conductivity type.

In an example of the present application, a second semiconductor region of a conductivity type identical to or different from the conductivity type of the first semiconductor region is arranged at one side of the first semiconductor region.

In an example of the present application, a third semiconductor region of a conductivity type different from the conductivity type of the first semiconductor region is arranged at a side edge of the first semiconductor region on the same layer.

In an example of the present application, the cell structure of a semiconductor device further comprises a first electric field shielding structure, which comprises: the semiconductor substrate; a first electric field shielding region of a second conductivity type arranged in the semiconductor substrate in a depth equal to the depth of the carrier barrier region or close to the depth of the carrier barrier region.

In an example of the present application, the first electric field shielding structure further comprises: a plurality of second trench units arranged at the top of the semiconductor substrate and at the outer side of the plurality of first trench units, a conductive material is arranged in the plurality of second trench units and is isolated from the semiconductor substrate by a third dielectric material; wherein the first electric field shielding region is arranged to abut the bottoms of the plurality of second trench units or adjacent to the side edges of the bottoms of the plurality of second trench units, and is isolated from the conductive material by the third dielectric material; and a second source-body region arranged in the gaps among the plurality of second trench units and located on the surface of the semiconductor substrate.

In an example of the present application, the second source-body region is of a first conductivity type or a second conductivity type.

In an example of the present application, the first electric field shielding structure further comprises: a third metal layer arranged at the top of the semiconductor substrate, the third metal layer contacts the second source-body region; and a fourth dielectric material arranged at the top of the semiconductor substrate, abutting the third metal layer, the fourth dielectric material covers the trench openings of some or all of the plurality of second trench units.

In an example of the present application, a part of the surface or the entire surface of the second source-body region contacts with the third metal layer.

In an example of the present application, the electric field shielding region and the carrier barrier region adjacent to each other contact or don't contact with each other.

In an example of the present application, the cell structure of a semiconductor device further comprises a second electric field shielding structure, which comprises: the semiconductor substrate; a second electric field shielding region of a second conductivity type arranged in the semiconductor substrate; a fourth metal layer arranged at the top of the semiconductor substrate; and a semiconductor region of a second conductivity type formed in the semiconductor substrate in the vertical direction, and the semiconductor region of a second conductivity type is in contact with the second electric field shielding region and the fourth metal layer.

In an example of the present application, the conductive material is polycrystalline silicon or a metal material with electrical conductivity.

In an example of the present application, the materials of the semiconductors described above include Silicon (Si) material or silicon carbide (SiC) material.

In an example of the present application, the first dielectric material, the second dielectric material, the third dielectric material and the fourth dielectric material may selectively employ insulating materials including silicon dioxide or benzocyclobutene (BCB) or polyimide (PI), and composite layers of silicon dioxide and other substances, such as composite layers of silicon dioxide and silicon nitride, and composite layers of silicon dioxide and polyimide (PI), etc.

Another object of the present application is to provide a semiconductor device, which comprises a cell region and a terminal region, wherein the cell region comprises more than one cells, the structure of the cell comprises: an N-type semiconductor substrate; a plurality of first trench units arranged at the top of the N-type semiconductor substrate, the plurality of first trench units are spaced apart, a conductive material is arranged in the plurality of first trench units and is isolated from the N-type semiconductor substrate by a first dielectric material; an N-type carrier barrier region arranged to abut the bottoms of the plurality of first trench units or adjacent to the side edges of the bottoms of the plurality of first trench units and isolated from the conductive material by the first dielectric material; a P-type first source-body region arranged in the gaps among the plurality of first trench units, with more than one N-type source regions arranged in the first source-body region, wherein the P-type first source-body region and the N-type source regions are located on the surface of the semiconductor substrate; a first metal layer arranged at the top of the N-type semiconductor substrate, the first metal layer is in contact with the P-type first source-body region and the N-type source regions; a second dielectric material arranged at the top of the N-type semiconductor substrate, adjacent to or abutting the first metal layer, the second dielectric material covers the trench openings of some or all of the plurality of first trench units; a P-type semiconductor region arranged at the bottom of the N-type semiconductor substrate; and a second metal layer arranged in contact with the P-type semiconductor region.

In the present invention, by means of the design of the carrier barrier region and the condition of doping concentration in the carrier barrier region higher than that in the semiconductor substrate, a conduction path or hole channel can be limited and a lower om-state voltage drop can be achieved while maintaining the functionality of the semiconductor device. Besides, a field limiting ring, a P-type floating island, or an electric field shielding structure as described above can be arranged at the outer side of a main structure of the cell structure and used as an electric field shielding region, thereby the sustaining voltage of the semiconductor device can be improved. In addition, the PMOS formed by the above-mentioned electric field shielding structure can not only enhance the benefit of electric field shielding, but also serve as a hole current channel, thus avoiding the turn-on of parasitic thyristors and improving the robustness of the devices. Furthermore, the main structure of the cell structure can be cooperated with a three-dimensional design of a P-type semiconductor region to form an electric field shielding structure contacting the cathode on the surface of semiconductor device, which can also achieve the effect of electric field shielding and improve the sustaining voltage. Moreover, since the number of trench units and the shallow trench are designed in parallel, even if the etching windows of a few trenches are misregistered, the doping concentration in the semiconductor region can also be adjusted, so as to avoid the occurrence of a poor conduction path or unexpected hole channel. Furthermore, the requirements such as the specifications and depths of the trenches are unified, thus the manufacturing process can be simplified and the difficulty in the manufacturing of the device can be reduced.

BRIEF DESCRIPTION OF THE DRAWINGS

In order to explain the technical solution in the examples of the present application more clearly, hereunder the drawings to be used in the description of the examples will be introduced briefly. Apparently, the drawings used in the description below only illustrate some examples of the present application. Those skilled in the art can obtain other drawings on the basis of these drawings without expending any creative labor.

DETAILED DESCRIPTION

Figure 1:
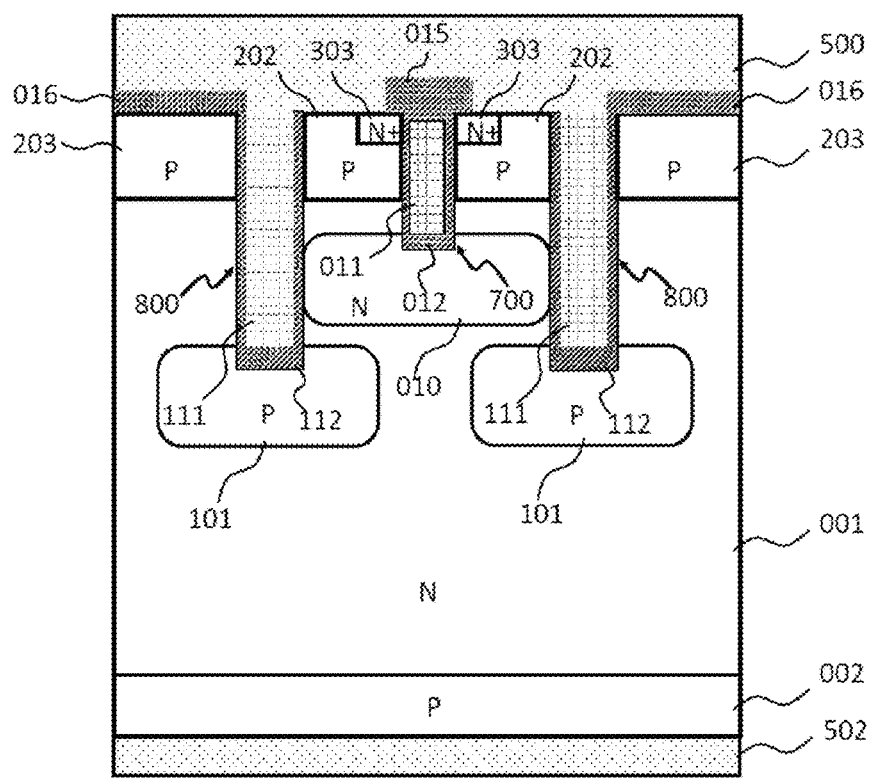
FIG. 1 is a schematic structural diagram of an exemplary semiconductor device using deep trenches and shallow trenches in combination.

Hereunder reference is made to the drawings, in which the same component symbols represent the same components. The following description is based on the illustrated specific examples of the present application, but should not be regarded as limiting other specific examples of the present application that are not detailed herein.

The following examples are described with reference to the accompanying drawings to illustrate specific examples that can be implemented according to the present application. The directional terms mentioned in the present application, such as [top], [bottom], [front], [back], [left], [right], [inside], [outside], [side], etc., only refer to the directions in the accompanying drawings. Therefore, the directional terms are used to illustrate and understand the present application but are not intended to limit the present application.

The terms "first", "second", and "third", etc. (if present) in the Description, Claims, and above-mentioned accompanying drawings of the present application are intended to differentiate similar objects, and may not be necessarily used to describe a specific order or precedence. It should be understood that the objects thus described can be interchanged under appropriate circumstances. In addition, the terms "comprise", and "have" and their variants are intended to cover non-exclusive inclusion.

The terms used in this specification of the present application are only used to describe specific embodiments, but are not intended to reveal the concept of the present application. Unless otherwise specified explicitly in the context, expressions used in singular forms encompass expressions in plural forms. In this specification of the present application, it should be understood that terms such as "comprise", "have" and "contain", etc., and their variants are intended to indicate the possibility of the existence of the features, numbers, steps, actions or combinations thereof disclosed in this specification, but are not intended to exclude the possibility of existence or addition of one or more other features, numbers, steps, actions or combinations thereof. The same reference numbers in the accompanying drawings refer to the same parts.

The accompanying drawings and description thereof should be regarded as essentially illustrative rather than limiting. In the drawings, elements with similar structures are represented by similar reference numbers. In addition, for the purpose of facilitating comprehension and description, the size and thickness of each component shown in the accompanying drawings are shown arbitrarily, but the present application is not limited thereto.

In the accompanying drawings, the configuration ranges of apparatuses, systems, components and circuits are exaggerated for the purpose of clarity, understanding and easy description. It should be understood that when a component is described to be "on" another component, the component may be directly on the other component, or an intermediate component may exist.

In addition, in the specification, unless otherwise described explicitly in the context, the term "comprise" or "include" and variants thereof should be understood as including the described components, but not excluding any other components. In addition, in the specification, the word "on . . . " means above or below the target component, and does not necessarily mean on the top based on the gravity direction.

In order to further explain the technical means employed by the present invention to achieve the intended object and their effects, hereunder the cell structure and the semiconductor device using the cell structure proposed according to the present invention, their specific embodiments, structures, features and effects will be detailed as follows.

FIG. 1 is a schematic structural diagram of an exemplary semiconductor device using deep trenches and shallow trenches in combination. Such a device is a novel power semiconductor device using deep trenches and shallow trenches in combination, MOS Controlled Quasi-Thyristor (MCKT). The device is composed of a plurality of cell units. FIG. 1 illustrates the sectional structure of one of the cells. The structure of the cell comprises: an N-type semiconductor substrate 001, with a P-type first semiconductor region 002 arranged at a side of the N-type semiconductor substrate 001 and served as an anode region. More than one first trench unit 700 and more than one second trench unit 800 are arranged at the other side of the N-type semiconductor substrate 001 respectively, and the depth of the first trench units 700 is smaller than that of the second trench units 800. An N-type carrier barrier region 010 having higher doping concentration than the N-type semiconductor substrate 001, which is also referred to as a minority carrier barrier region, is arranged at the bottoms of the first trench units 700; and a P-type electric field shielding region 101 is arranged at the bottoms of the second trench units 800. A conductive material is arranged in the first trench units 700 and the second trench units 800, and the conductive material may be polycrystalline silicon or a material with electrical conductivity. The conductive material in the first trench units 700 serves as a first gate region 011, and the conductive material in the second trench units 800 serves as a second gate region 111. The first gate region 011 and the second gate region 111 are isolated from the N-type semiconductor substrate 001 respectively by a first dielectric material 012 and a second dielectric material 013. The side edges of the N-type carrier barrier region 010 contact the second dielectric material 013 of the second trench units 800. A P-type source-body region 202 is arranged between the first trench unit 700 and the second trench unit 800, and an N-type source region 303 is arranged in the P-type source-body region 202 and is adjacent to the first dielectric material 012 at one side of the first trench unit 700. A P-type floating semiconductor region 203 is arranged outside the first trench units 700 and the second trench units 800. The first electrode 500 and the second electrode 502 include a metal material or are made of a metal material. The first electrode 500 contacts at least part of the second gate regions 111, at least part of the P-type source-body regions 202 and at least part of the N-type source regions 303, and the second electrode 502 covers the P-type first semiconductor region 002. A third dielectric material 015 is arranged between the first gate regions 011 and the first electrode 500 for isolating the first gate regions 011 and the first electrode 500. A fourth dielectric material 016 is arranged between the P-type floating semiconductor region 203 and the first electrode 500 for isolating the P-type floating semiconductor region 203 and the first electrode 500. The first gate region 011 is the gate electrode of the device, and the first electrode 500 and the second electrode 502 are the cathode and anode of the device respectively.

From the above description, it could be seen that the first trench unit 700, the N-type carrier barrier region 010, the P-type source-body region 202 and the N-type source region 303 constitute an NMOS structure. The N-type source region 303 is the source region of electrons of the NMOS, the N-type carrier barrier region 010 is the drain region of electrons of the NMOS, and the first gate region 011 is the gate region of the NMOS. When the voltage $V_{CE}$ between the second electrode 502 and the first electrode 500 is greater than zero and the voltage $V_{CE}$ between the first gate region 011 and the first electrode 500 exceeds a threshold voltage $V_{THN}$ of the NMOS, the NMOS channel is turned on, and electrons travel from the N-type source region 303 through the P-type source-body region 202, the N-type carrier barrier region 010 and the N-type semiconductor substrate 001 to the P-type first semiconductor region 002. On the contrary, the holes travel from the P-type first semiconductor region 002 through the N-type semiconductor substrate 001 and the P-type electric field shielding region 101 to the N-type carrier barrier region 010. The built-in potential formed between the N-type semiconductor substrate 001 and the N-type carrier barrier region 010 hinders the flow of the holes to the P-type source-body region 202, and the hole concentration in the N-type semiconductor substrate 001 is significantly increased near the N-type carrier barrier region 010 and thus forms a strong conductivity modulation, thereby the current density of the device is greatly improved. That is to say, at the same current density, the device has a lower on-state voltage drop $V_{ON}$ than an IGBT.

When the voltage $V_{CE}$ between the second electrode 502 and the first electrode 500 is high, the negatively charged ionized acceptors in the partially depleted P-type electric field shielding region 101 absorb the electric flux lines generated by the positively charged ionized donors in the depleted N-type semiconductor substrate 001, so that only a few electric flux lines reach the gate region 011. Therefore, the electric field around the dielectric layer at the bottoms of the first trench unit 700 and the second trench unit 800 is low, thus a high blocking voltage is obtained and the lifetime of the dielectric layer is prolonged, thereby the reliability of the device is improved. Owing to the fact that the P-type electric field shielding region 101 shields most of the electric flux lines from the N-type semiconductor substrate 001, the charges in the first gate region 011 become insensitive to the change of the collector potential, which is reflected as the decrease of the gate-collector capacitance ($C_{GC}$).

Although the device shown in FIG. 1 has the above-mentioned advantages, the doping concentrations and doping levels of the semiconductor materials in different parts should be adjusted strictly in the manufacturing process of the power semiconductor devices using deep trenches and shallow trenches in combination, in order to effectively control the performance of the devices. Therefore, the process requirements are relatively rigorous. Especially, the depth of each trench, width of trench opening, and arrangement spacing of the trenches are particular, depending on the function of the device. Once minor errors occur, the function of the device may be different from the designed function; in addition, it is not easy to miniaturize the device if too many trenches are designed. Furthermore, one intention of the original deep trench is to cooperate with the minority carrier barrier region, so as to confine the holes to flow out of the device from the P-type source-body region 202. If the trench etching window is misregistered, the doping concentration in the N-type carrier barrier region 010 on the surface of the dielectric layer 013 at one side will be low, thus providing a channel for the holes to flow out of the device from the P-type source-body region 202, consequently the device loses the advantage of low on-state voltage drop.

Figure 2:
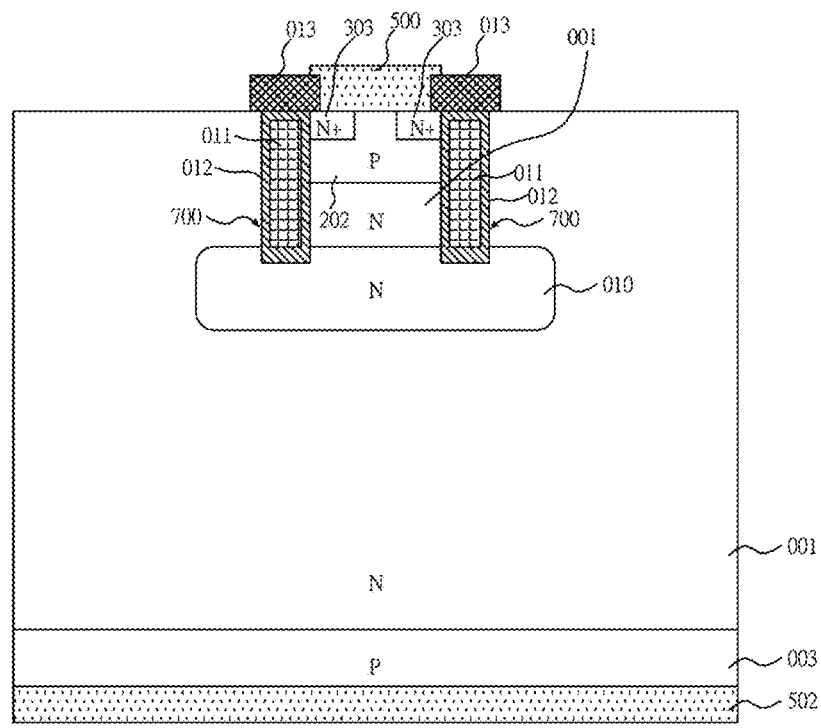
FIG. 2 is a schematic diagram of the cell structure of a semiconductor device according to an example of the present application.
Figure 3:
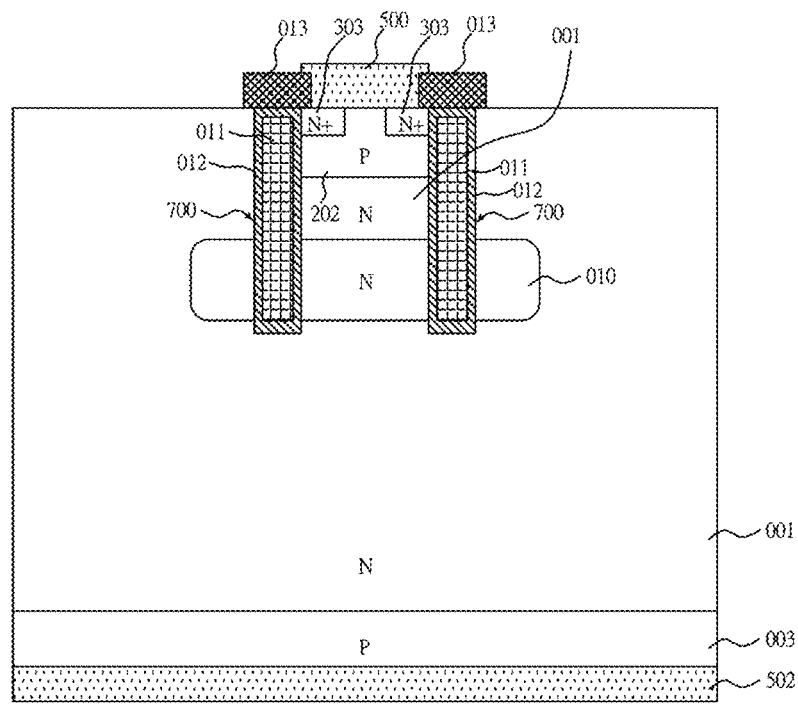
FIG. 3 is a schematic diagram of the cell structure of a semiconductor device according to an example of the present application.
Figure 4:
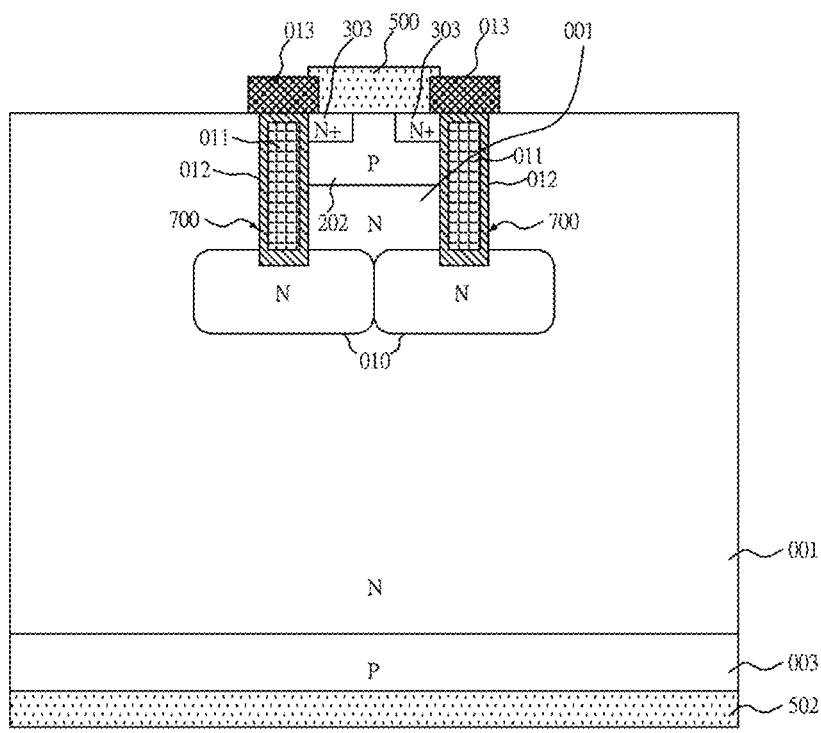
FIG. 4 is a schematic diagram of the cell structure of a semiconductor device according to an example of the present application.

FIGS. 2-4 are schematic diagrams of the cell structure of a semiconductor device according to some examples of the present application. The cell structure comprises: a semiconductor substrate 001 of a first conductivity type; a plurality of first trench units 700 arranged in the top surface region of the semiconductor substrate 001, the plurality of first trench units 700 is spaced apart, a conductive material 011 is arranged in the plurality of first trench units 700 and is isolated from the semiconductor substrate 001 by a first dielectric material 012; a carrier barrier region 010 of a first conductivity type arranged to abut the plurality of first trench units 700 and isolated from the conductive material 011 by the first dielectric material 012; a first source-body region 202 of a second conductivity type arranged in the gaps among the plurality of first trench units 700, with more than one source region 303 arranged in the first source-body region 202, the first source-body region 202 and the source regions 303 are located in the surface of the semiconductor substrate 001; a first metal layer 500 arranged at the top of the second semiconductor substrate 002, the first metal layer 500 contacts the first source-body region 202 and the source regions 303; a second dielectric material 013 arranged at the top of the second semiconductor substrate 002, adjacent to or abutting the first metal layer 500, the second dielectric material 013 covers some or all trench openings of the plurality of trench units 770; a first semiconductor region 003 arranged in the bottom region of the first semiconductor substrate 001; and a second metal layer 502 arranged to be in contact with the first semiconductor region 003. The second metal layer 502 is combined with the first semiconductor region 003 as an anode region. The first metal layer 500 serves as a cathode region opposite to the anode region.

For the convenience of understanding, the conductivity types of the semiconductor regions are supposed to be the same as those in FIG. 1 temporarily, and the first conductivity type is N-type and the second conductivity type is P-type.

Unlike the device shown in FIG. 1, in the cell structure in this example of the present application, the electric field shielding region is not arranged in the main structure, and no deep trench structure connected with the electric field shielding region is provided. In the case that the conductivity types of the semiconductor regions are the same as those in FIG. 1, when the voltage $V_{CE}$ between the anode (the second metal layer 502) and the cathode (the first metal layer 500) is greater than zero and the voltage $V_{GE}$ between the gate region 011 and the first metal layer 500 exceeds a threshold voltage $V_{THN}$ of the NMOS composed of the first trench unit 700, the N-type carrier barrier region 010, the p-type source-body region 202 and the N-type source region 303, the NMOS channel is turned on, and electrons travel from the N-type source region 303 through the P-type source-body region 202, the N-type carrier barrier region 010 and the N-type semiconductor substrate 001 to the P-type first semiconductor region 003. On the contrary, the holes travel from the P-type first semiconductor region 003 through the N-type semiconductor substrate 001 to the N-type carrier barrier region. The built-in potential formed between the N-type semiconductor substrate 001 and the N-type carrier barrier region 010 hinders the flow of the holes to the P-type source-body region 202, thus the hole concentration is significantly increased near the N-type carrier barrier region 010 and its vicinity, forming a strong conductivity modulation, thus the current density of the device is greatly increased and the positions of generation of the electron path and the hole path are limited. Therefore, even if the deep trench design is not employed, the hole path will not be generated at any additional position. Moreover, at the same current density, the device has a lower on-state voltage drop $V_{ON}$ than an IGBT. Even if the etching window of the first trench unit 700 is misregistered, no additional hole path will be formed, thus the predetermined functional property of low on-state voltage drop of the semiconductor device is maintained.

As shown in FIG. 2, in some examples, there is only one carrier barrier region 010, which is arranged in a wide range, the carrier barrier region 010 is arranged to abut the bottoms of the plurality of first trench units 700.

As shown in FIG. 3, in some examples, the carrier barrier region 010 is arranged to abut the side edges near the bottoms of the plurality of first trench units 700. That is to say, the carrier barrier region 010 may be arranged only in the gaps among the plurality of first trench units 700, or may be further arranged on the two sides of each first trench unit 700. In the manufacturing process, trenches may be made first, and then semiconductor doping (implanting) may be performed according to the predetermined position of the carrier barrier region 010; alternatively, semiconductor doping (implanting) may be performed first, and then trenches may be made.

As shown in FIG. 2, in an example of the present application, the number of the carrier barrier region is one, and the plurality of first trench units are in contact with the carrier barrier region together.

As shown in FIG. 4, in some examples, a plurality of carrier barrier regions 010 may be provided, and each of the plurality of first trench units 700 contacts a corresponding carrier barrier region 010 among the plurality of carrier barrier regions 010.

The quantity and arrangement mode of the carrier barrier regions 010 shown in FIGS. 2-4 may be determined according to the design requirements, and are applicable to structure examples of the same or similar semiconductor devices, but the present invention is not limited to them.

In an example of the present application, the widths of the trench openings of the plurality of first trench units 700 are equal to or different from each other.

In an example of the present application, the depths of the plurality of first trench units 700 are equal to or different from each other.

In an example of the present application, the side edge of the first source-body region 202 contacts the side edge of an adjacent first trench unit 700, and the source region 303 contacts the first dielectric material 012 of the adjacent first trench unit 700.

In an example of the present application, the second dielectric material 013 abuts the first metal layer 500, covers all the trench openings of the plurality of first trench units 700, and contacts part of or all of the source regions 303.

In an example of the present application, the side edge of the first source-body region 202 contacts the side edge of an adjacent first trench unit 700, and the source regions 303 contact the first dielectric material 012.

In an example of the present application, the source regions 303 are of a first conductivity type or a second conductivity type.

In an example of the present application, the source regions 303 are heavily doped regions or lightly doped regions.

Figure 5:
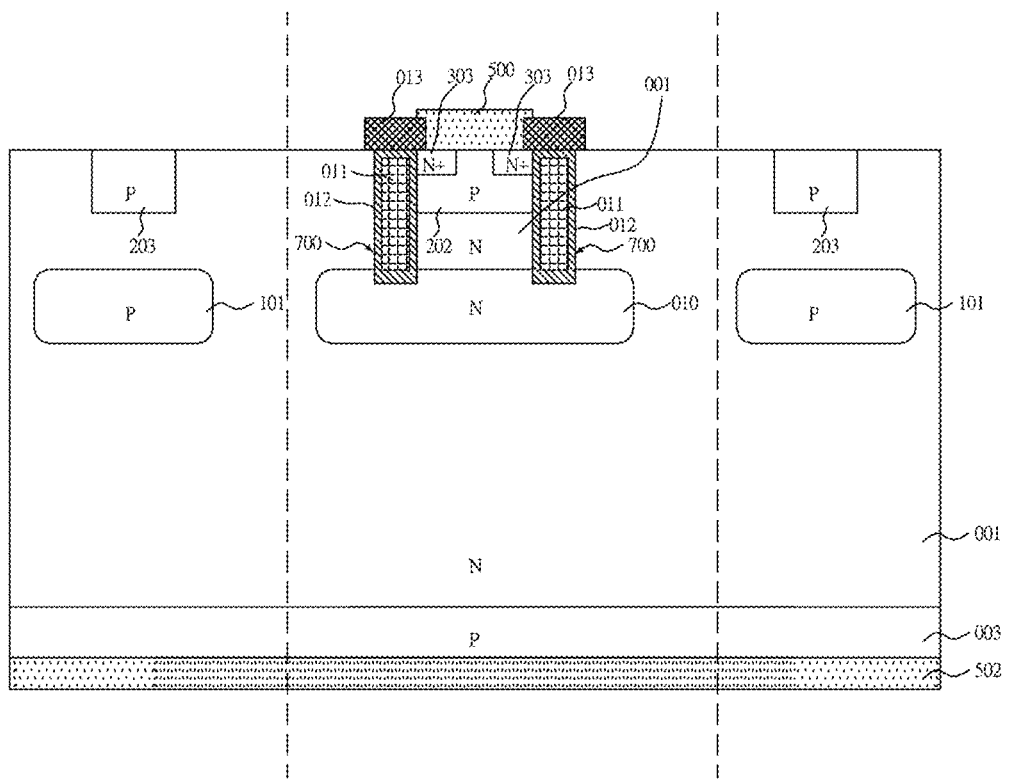
FIG. 5 is a schematic diagram of the first electric field shielding structure of the semiconductor device according to an example of the present application.

FIG. 5 is a schematic diagram of the first electric field shielding structure of the semiconductor device according to an example of the present application. Different from the previous example, it further comprises a first electric field shielding structure. In FIG. 5, the first electric field shielding structure is arranged on the two outer sides of the main structure of the cell, and is distinguished in structure by dashed lines. However, in actual applications, the specific arrangement is not limited to that. The first electric field shielding structure may be selectively arranged on at least one of the two outer sides of the main structure of the cell. In an example of the present application, the first electric field shielding structure comprises: the semiconductor substrate 001; a first electric field shielding region 101 of a second conductivity type arranged in the semiconductor substrate 001 in a depth equal or close to the depth of the carrier barrier region 010.

Figure 6:
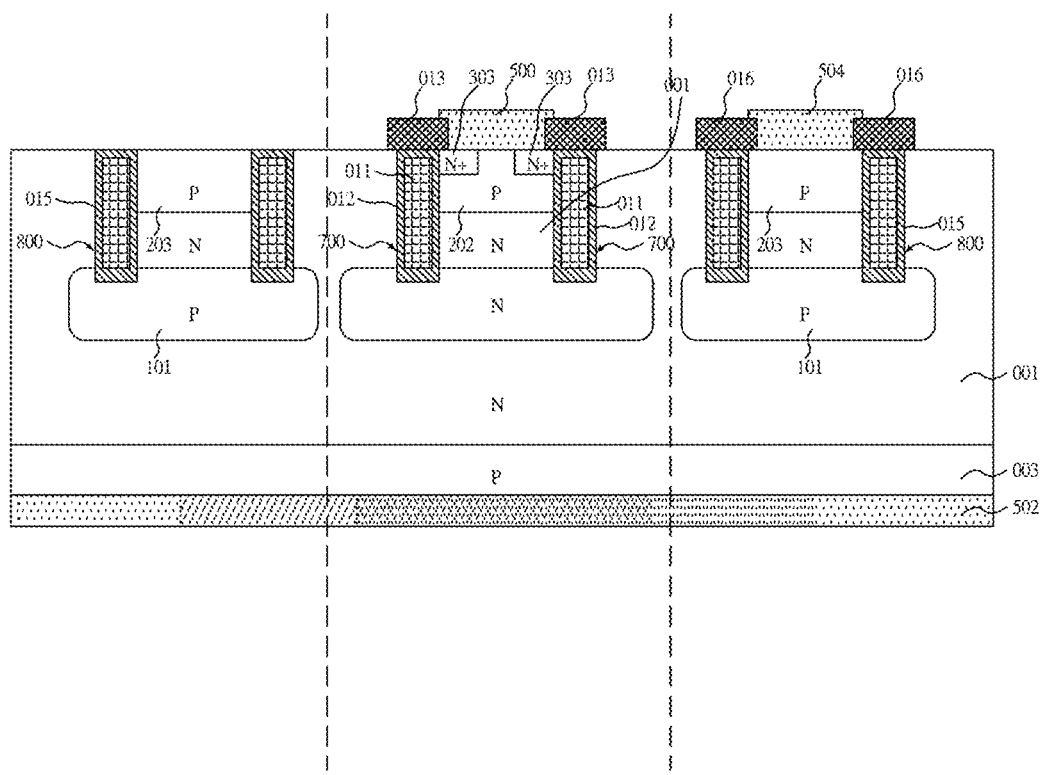
FIG. 6 is a schematic diagram of the first electric field shielding structure of the semiconductor device according to an example of the present application.

FIG. 6 is a schematic diagram of the first electric field shielding structure of the semiconductor device according to an example of the present application. In an example of the present application, the first electric field shielding structure further comprises: a plurality of second trench units 800 arranged in the top surface region of the semiconductor substrate 001 and at the outer side of the plurality of first trench units 700, a conductive material is arranged in the plurality of second trench units 800 and isolated from the semiconductor substrate 001 by a second dielectric material 013, the first electric field shielding region 101 is arranged to abut the bottoms of the plurality of second trench units 800 or adjacent to the side edges of the bottoms of the plurality of second trench units 800, and is isolated from the conductive material by the third dielectric material 015; and a second source-body region 203 arranged in the gaps among the plurality of second trench units 800, the second source-body region 203 is located on the surface of the semiconductor substrate 001.

In an example of the present application, the second source-body region 203 is of a first conductivity type or a second conductivity type. That is to say, according to the functional requirements for the semiconductor device, the second source-body region 203 is an N-type source-body region or a P-type source-body region.

As shown in FIG. 6, in an example of the present application, further comprising a third metal layer 504 arranged at the top of the semiconductor substrate 001, the third metal layer 504 contacts the second source-body region 203; and a fourth dielectric material 016 is arranged at the top of the semiconductor substrate 001 and abuts the third metal layer 504, the fourth dielectric material 016 covers some or all of the trench openings of the plurality of second trench units 800.

In an example of the present application, a part of the surface or the entire surface of the second source-body region 203 contacts the third metal layer 504.

In some examples, both the first metal layer 500 and the third metal layer 504 are connected to the cathode of the semiconductor device.

In an example of the present application, the first electric field shielding region 101 and the carrier barrier region 010 adjacent to each other don't contact with each other.

Figure 7:
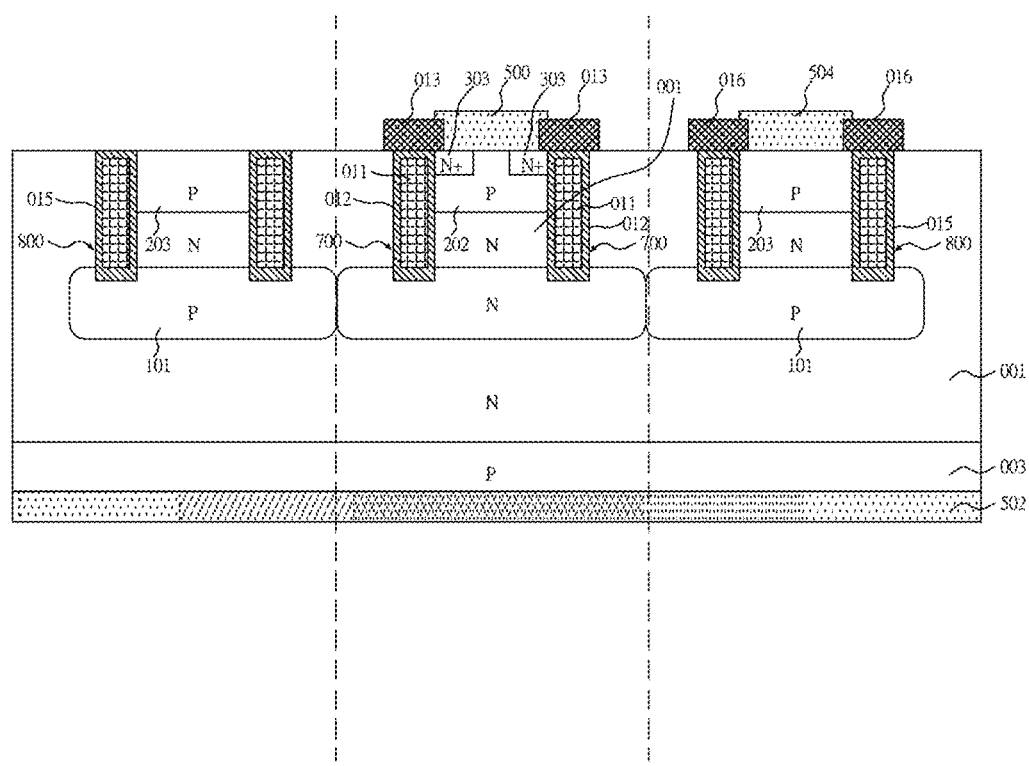
FIG. 7 is a schematic diagram of the first electric field shielding structure of the semiconductor device according to an example of the present application.

FIG. 7 is a schematic diagram of the first electric field shielding structure of the semiconductor device according to an example of the present application. In an example of the present application, the first electric field shielding region 101 and the carrier barrier region 010 are arranged in the same depth or in similar depths, and the first electric field shielding region 101 and the carrier barrier region 010 adjacent to each other contact with each other.

The quantity and arrangement mode of the first electric field shielding structures shown in FIGS. 5-7 may be determined according to the design requirements, and are applicable to structure examples of the same or similar semiconductor devices, but the present invention is not limited to them.

In actual application, the first electric field shielding region 101 may contact the carrier barrier region 010 owing to the process accuracy, even if they are not intended to contact with each other. In addition, the drawings disclosed in the present application are only illustrative. The first electric field shielding region 101 and the carrier barrier region 010 may have bias in semiconductor region position, bias in depth, range diffusion and other defects owing to the accuracy of the doping and infusion process, but the functionality and operation of the device can be regarded as identical to those of the device disclosed in the present application in principle.

In some examples, the main structure of the cell structure of the semiconductor device can be regarded as a basic unit. In view that the doping concentration in the carrier barrier region is high and the withstand voltage of the device is low, the electric field shielding structures shown in FIGS. 5-7 above may be provided as an assistance. The first electric field shielding region 101 may be a heavily doped region or a lightly doped region, but the efficacy of the heavily doped region is better. The first electric field shielding region 101, the semiconductor substrate 001, the second source-body region 203, the second trench unit and the conductive material therein form a PMOS structure. When the device is turned off, the PMOS structure is turned on, and the potential of the first electric field shielding region 101 is close to the potential of the cathode. The first electric field shielding region 101 and the semiconductor substrate 001 form a reverse bias of the PN junction and begin to deplete each other. Most of the electric flux lines emitted positively charged ionized donors from the semiconductor substrate 001 are absorbed by negatively charged ionized acceptors in the electric field shielding region, so that the electric flux lines reaching the source-body region 202 are essentially shielded, thereby the voltage withstanding property of the semiconductor device is improved. In some examples, electric field shielding structures are arranged on both sides of the main structure of the cell structure. After the N-type region between the two first electric field shielding regions 101 is completely depleted, the electric flux lines emitted from the semiconductor substrate 001 hardly reach the source-body region 202, thus a full electric field shielding effect is formed as far as possible, and the voltage withstanding benefit of the semiconductor device is better.

In some examples, the PMOS formed by the electric field shielding structure may also be used as an hole current channel when the device is turned off, so as to prevent the turn-on of parasitic thyristors, thereby the robustness of the semiconductor device is improved.

Figure 8:
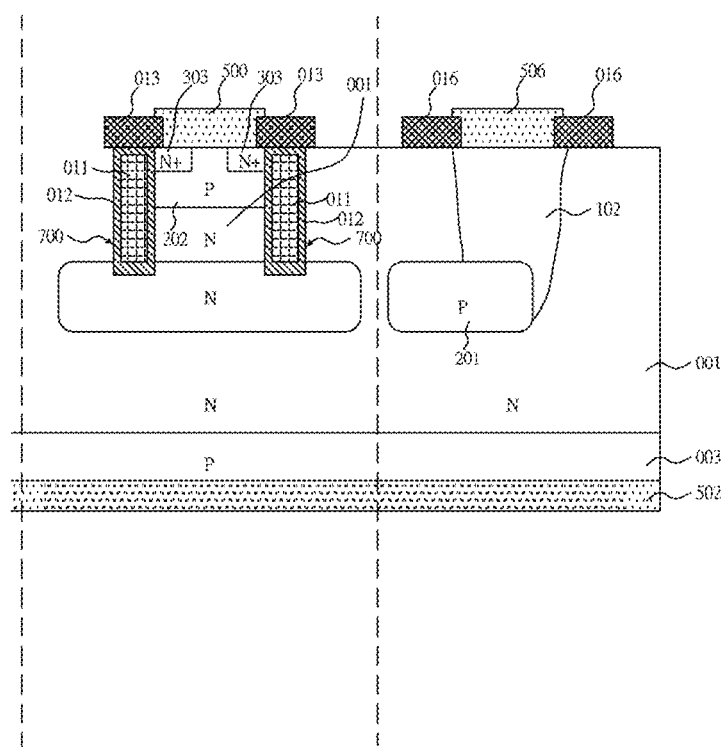
FIG. 8 is a schematic diagram of the second electric field shielding structure of the semiconductor device according to an example of the present application.

FIG. 8 is a schematic structural diagram of the second electric field shielding structure of the semiconductor device according to an example of the present application. In an example of the present application, the cell structure further comprises a second electric field shielding structure. The second electric field shielding structure comprises: the semiconductor substrate 001; a second electric field shielding region 201 of a second conductivity type arranged in the semiconductor substrate 001; a fourth metal layer 506 arranged at the top of the semiconductor substrate 001; and a semiconductor region 102 of a second conductivity type formed in the semiconductor substrate 001 in the vertical direction, the semiconductor region 102 of a second conductivity type is in contact with the second electric field shielding region 201 and the fourth metal layer 506. In some examples, the fourth dielectric material 016 is arranged on the surface of the semiconductor substrate 001 and between the fourth metal layer 506 and the semiconductor substrate 001, and the fourth dielectric material 016 partially covers the peripheral part of the surface of the semiconductor region 102.

In some examples, under the influence of the semiconductor region 102, the potential of the second electric field shielding region 201 is close to the potential of the cathode, and the second electric field shielding region 201 and the semiconductor substrate 001 form a reverse bias of the PN junction and begin to deplete each other. Most of the electric flux lines emitted by the positively charged ionized donors from the semiconductor substrate 001 are absorbed by negatively charged ionized acceptors in the electric field shielding region, so that the electric flux lines reaching the source-body region 202 are essentially shielded, thereby the voltage withstanding property of the semiconductor device is improved.

FIG. 8 is only intended to illustrate the electric field shielding structure. In some examples, electric field shielding structures are arranged on both sides of the main structure of the cell structure, but the specific arrangement mode is that of the different electric field shielding structures described above are selectively arranged on both sides of the main structure of the cell structure.

In an example of the present application, the first conductivity type is N-type, and the second conductivity type is P-type.

In an example of the present application, the first conductivity type is P-type, and the second conductivity type is N-type.

In an example of the present application, the source regions 303 are of a first conductivity type or a second conductivity type.

In an example of the present application, the source regions 303 are heavily doped regions or lightly doped regions.

In an example of the present application, the source region 303 serves as an electron source region in the case that it is of N-type, while the source region 303 serves as an hole source region in the case that it is of P-type.

In an example of the present application, a first semiconductor region 003 is arranged between the first semiconductor substrate 001 and the second metal layer 502. As described above, the first semiconductor region 003 is of a second conductivity type; alternatively, the conductivity type of the first semiconductor region 003 is identical to that of the first semiconductor substrate 001.

a second semiconductor region 004 of a conductivity type identical to or different from that of the first semiconductor region 003 is arranged at one side of the first semiconductor region 003.

In an example of the present application, a third semiconductor region 005 of a conductivity type different from that of the first semiconductor region 003 is arranged at a side edge of the first semiconductor region 003 on the same layer.

Figure 9:
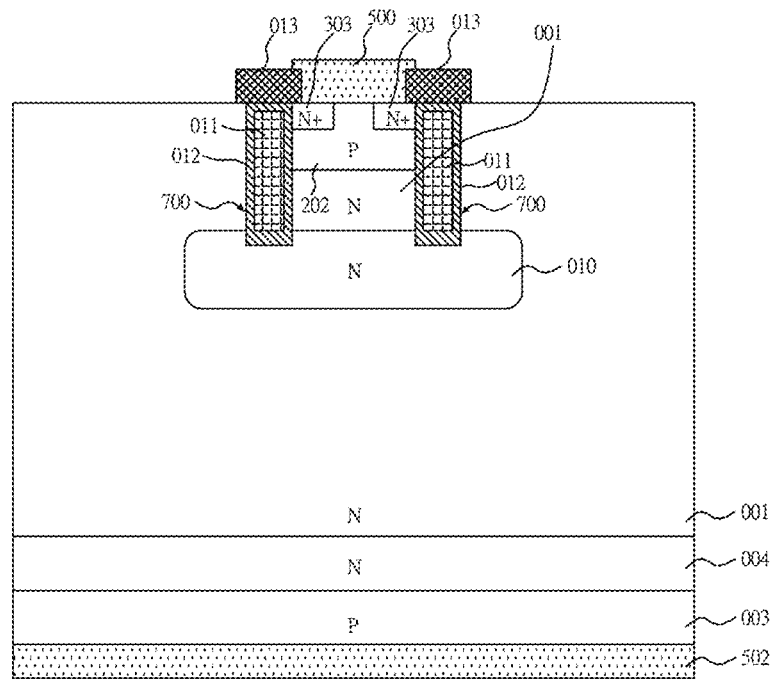
FIG. 9 is a schematic diagram of a punch-through cell structure or field-stop cell structure according to an example of the present application.

FIG. 9 is a schematic diagram of a punch-through cell structure or field-stop cell structure according to an example of the present application. In an example of the present application, a second semiconductor region 004 of a first conductivity type is arranged at a side of the first semiconductor region 003, serving as a field-stop region, and the doping concentration in the second semiconductor region 004 is higher than that in the first semiconductor substrate 001. When the highest voltage is applied between the anode and the cathode, the electric field is stopped in the field-stop region, and the field-stop region will not be completely depleted. Therefore, with the field-stop structure shown in FIG. 9, a smaller thickness of the first semiconductor substrate 001 is obtained, thereby a smaller on-state voltage drop ($V_{ON}$) can be obtained. Besides, owing to the fact that the total amount of carriers in the first semiconductor substrate 001 is proportional to the thickness of the first semiconductor substrate 001, the total amount of carriers can be decreased. Under certain current, the time required for the semiconductor device to switch from the on-state to the off-state or from the off-state to the on-state is shorter, thus smaller switching loss can be achieved.

Figure 10:
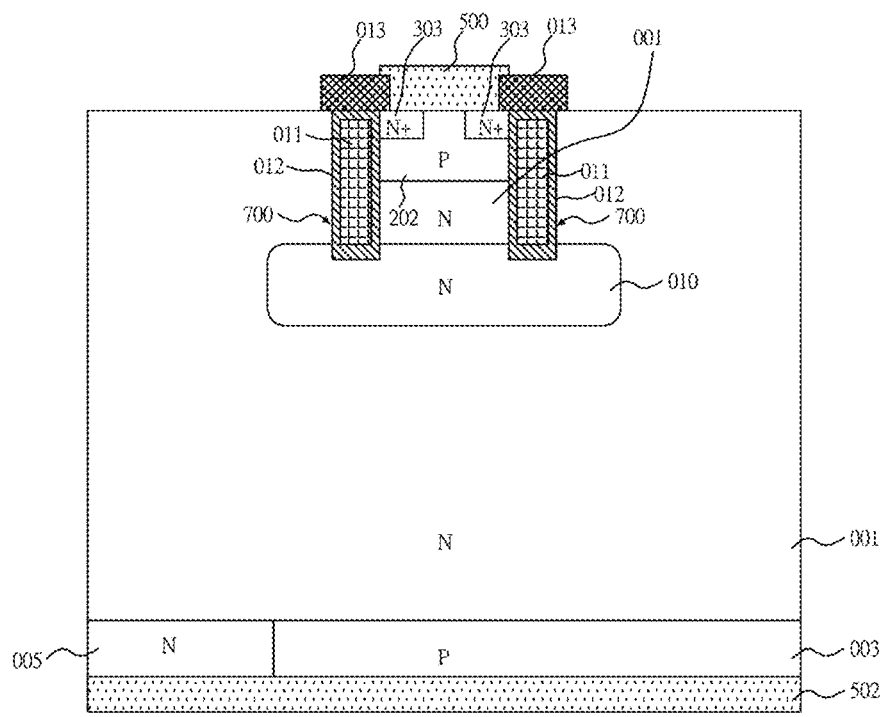
FIG. 10 is a schematic diagram of a reverse-conduction cell structure according to an example of the present application.

FIG. 10 is a schematic diagram of a reverse-conduction cell structure according to an example of the present application. In an example of the present application, a third semiconductor region 005 of a first conductivity type is arranged at a side edge of the first semiconductor region 003 on the same layer. Both the first semiconductor region 003 and the third semiconductor region 005 directly contact the second metal layer 502, forming an anode-short structure. Here, it is also illustrated by supposing that the first conductivity type is N-type, and the second conductivity type is P-type. A body diode is composed of a P-type source-body region 202, an N-type carrier barrier region 010, an N-type first semiconductor substrate 001 and an N-type third semiconductor region 005, wherein the P-type source-body region 202 is the anode of the body diode and the N-type third semiconductor region 005 is the cathode of the body diode. In an example of the present application, when the potential of the cathode (the first metal layer 500) is higher than the potential of the anode (the second metal layer 502), the body diode is forward-biased, and current flows from the P-type source-body region 202 through the N-type carrier barrier region 010 and the N-type first semiconductor substrate 001 to the N-type third semiconductor region 005. Owing to the existence of the N-type carrier barrier region 010, the hole injection efficiency of the anode of the body diode is greatly decreased, thus extremely low charge concentration is achieved near the anode region when the body diode is turned on, thereby low turn-off loss can be achieved.

Figure 11:
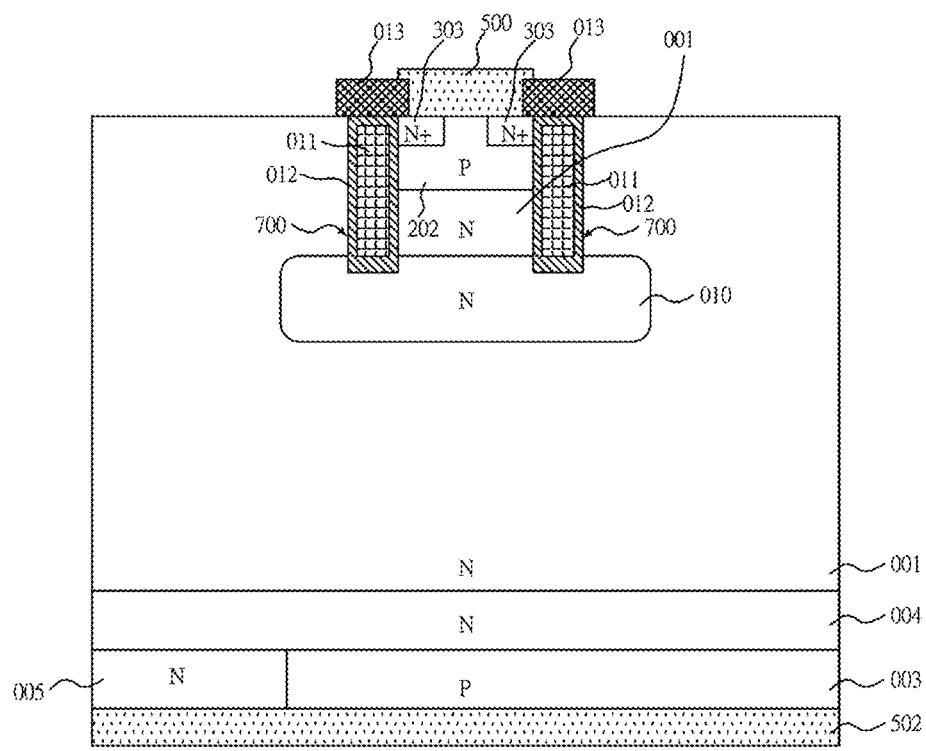
FIG. 11 is a schematic diagram of a combined field-stop and reverse-conduction cell structure according to an example of the present application.

FIG. 11 is a schematic diagram of the combined field-stop and reverse-conduction cell structure according to an example of the present application, and the illustrated structure has the electrical properties described in FIG. 9 and FIG. 10, which is not further detailed here.

In an example of the present application, the semiconductor substrate 001 shown in FIGS. 1-8 is a non-punch-through semiconductor substrate, which is to say, the semiconductor substrate 001 will not be completely depleted when the highest voltage is applied between the collector and the emitter; FIG. 9 shows the cell structure of a punch-through type or field-stop type; FIG. 10 shows the cell structure of a reverse-conduction type; FIG. 11 shows the combination of the cell structures shown in FIG. 9 and FIG. 10. However, the above examples are not limited to the illustrated respective structures, and each of the examples is applicable to non-punch-through structure, punch-through structure, field-stop structure and anode-short structure, or a structure equivalent/similar to the above structures.

In an example of the present application, the conductive material 011, the first metal layer 500, the second metal layer 502, the third metal layer 504 and the fourth metal layer 506 are selectively made of polycrystalline silicon or metal materials with electric conductivity.

In an example of the present application, the metal layers are integrally connected or connected via conductive elements. No matter what connection method is employed, it has no significant influence on the functionality of the semiconductor device.

In an example of the present application, the materials of the semiconductors described above include Silicon (Si) material or silicon carbide (SiC) material.

In an example of the present application, the first dielectric material 012, the second dielectric material 013, the third dielectric material 015 and the fourth dielectric material 016 may selectively employ insulating materials including silicon dioxide or benzocyclobutene (BCB) or polyimide (PI), and composite layers of silicon dioxide and other substances, such as composite layers of silicon dioxide and silicon nitride, and composite layers of silicon dioxide and polyimide (PI), etc.

Another object of the present application is to provide a semiconductor device, which comprises a cell region and a terminal region, wherein the cell region comprises more than one cells, the structure of cells comprises: an N-type semiconductor substrate 001; a plurality of first trench units 700 arranged in the top surface region of the N-type second semiconductor substrate 002, the plurality of first trench units 700 are spaced apart, a conductive material 011 is filled in the plurality of first trench units 700 and is isolated from the N-type semiconductor substrate 001 by a first dielectric material 012; an N-type carrier barrier region 010 arranged to abut the bottoms of the plurality of first trench units 700 or adjacent to the side edges of the bottoms of the plurality of first trench units 700 and isolated from the conductive material 011 by the first dielectric material 012; a P-type first source-body region 202 arranged in the gaps among the plurality of first trench units 700, more than one N-type source regions 303 are arranged in the P-type source-body region 202, the P-type source-body region 202 and the N-type source regions 303 are located in the top surface region of the N-type second semiconductor substrate 002; a first metal layer 500 arranged at the top of the N-type second semiconductor substrate 002, the first metal layer 500 is in contact with the source-body region 202 and the source regions 303; a second dielectric material 013 arranged at the top of the second semiconductor substrate 002, adjacent to or abutting the first metal layer 500, the second dielectric material 013 covers some or all of the trench openings of the plurality of first trench units 700; a P-type semiconductor region 003 arranged at the bottom of the N-type semiconductor substrate 001; and a second metal layer 502 arranged in contact with the P-type semiconductor region 003.

In the present application, by means of the design of the carrier barrier region and a condition of doping concentration in the carrier barrier region higher than that in the semiconductor substrate, a conduction path or channel of the holes can be defined, thereby a lower on-state voltage drop can be achieved while maintaining the functionality of the semiconductor device. Besides, the first electric field shielding structure or the second electric field shielding structure as described above may be selectively arranged as electric field shielding regions at the outer sides of the main structure of the cell structure, thereby the voltage withstanding property of the semiconductor device can be improved. In addition, the PMOS formed by the above-mentioned first electric field shielding structure can not only attain an electric field shielding effect, but also serve as an hole current channel when the device is turned off, thus avoiding the turn-on of parasitic thyristors and improving the robustness of the device. Furthermore, the main structure of the cell structure can be provided with a P-type semiconductor region doped three-dimensionally to form an electric field shielding structure contacting the cathode of the surface semiconductor device, which can also achieve the effect of electric field shielding and improve the voltage withstanding property. Moreover, since the number of trench units and the shallow trench are design in parallel, even if the etching windows of a few trenches are misregistered, the doping concentration in the semiconductor region can also be adjusted, so as to avoid the occurrence of a poor conduction path or unexpected hole channel. Furthermore, the requirements such as the specifications and depths of the trenches are unified, thus the manufacturing process can be simplified and the difficulty in the manufacturing of the device can be reduced.

As described above, the first conductivity type and the second conductivity type are different from each other, for example: the first conductivity type is P-type, while the second conductivity type is N-type; alternatively, the first conductivity type is N-type, while the second conductivity type is P-type. In other words, the N-type and P-type in the above description is interchangeable, and the corresponding electrons and the holes can also be interchangeable, and the principle of the present invention still applies after interchange of the conductivity types.

Expressions such as "in an example of the present application" and "in various examples" are repeatedly used throughout the specification. Such an expression usually doesn't refer to the same example; however, it may also refer to the same example. Terms such as "comprise", "have" and "include", etc. are synonyms, unless otherwise indicated in the context.

The examples described above are only specific examples of the present application, which are not intended to limit the present application in any forms. While the present application is described above in specific embodiments, it is not used to limit the present application to those examples. Those skilled in the art can make changes or modifications to the embodiments based on the above technical disclosure to obtain equivalent embodiments, without departing from the scope of the technical solution of the present application. However, any such simple modification or equivalent variation made to the above examples on the basis of the technical essentials of the present application without departing from the scope of the technical solution of the present application shall be deemed as falling in the scope of protection of the technical solution of the present application.

The subject matter of the present application can be manufactured and used in industry and has industrial practicability.

What is claimed is:

1. A cell structure of a semiconductor device, the cell structure comprising:
   a semiconductor substrate of a first conductivity type;
   a plurality of first trench units arranged in the top surface region of the semiconductor substrate, the plurality of first trench units spaced apart, a conductive material filled in the plurality of first trench units and isolated from the semiconductor substrate by a first dielectric material;
   a carrier barrier region of the first conductivity type arranged to abut the bottoms of the plurality of first trench units or close to side edges of the bottoms of the plurality of first trench units and isolated from the conductive material by the first dielectric material, wherein the doping concentration of the carrier barrier region is higher than the doping concentration of the semiconductor substrate;
   a first source-body region of a second conductivity type arranged in gaps among the plurality of first trench units, wherein more than one source regions of the first conductivity type are arranged in the first source-body region, wherein the first source-body region and the source regions are located in the top surface region of the semiconductor substrate;
   a first metal layer arranged at the top of the semiconductor substrate, wherein the first metal layer is in contact with the first source-body region and the source regions;

a second dielectric material arranged at the top of the semiconductor substrate, adjacent to or abutting the first metal layer, wherein the second dielectric material covers some or all of the trench openings of the plurality of first trench units;

a first semiconductor region arranged in the bottom region of the semiconductor substrate;

a second metal layer arranged in contact with the first semiconductor region;

a first electric field shielding region of the a-second conductivity type arranged in the semiconductor substrate in a depth equal or close to the depth of the carrier barrier region;

a plurality of second trench units arranged in the top surface region of the semiconductor substrate and at the outer side of the plurality of first trench units, wherein the conductive material is filled in the plurality of second trench units and is isolated from the semiconductor substrate by a third dielectric material;

a second source-body region arranged in the gaps among the plurality of second trench units and located on the surface of the semiconductor substrate;

a third metal layer arranged at the top of the semiconductor substrate, wherein the third metal layer is in contact with the second source-body region and a part of the surface or the entire surface of the second source-body region contacts the third metal layer; and a fourth dielectric material arranged at the top of the semiconductor substrate, abutting the third metal layer, the fourth dielectric material covering some or all of the trench openings of the plurality of second trench units;

wherein the first electric field shielding region is arranged to abut the bottoms of the plurality of second trench units or adjacent to the side edges of the bottoms of the plurality of second trench units, and is isolated from the conductive material by the third dielectric material.

2. The cell structure of a semiconductor device according to claim 1, wherein the number of the carrier barrier region is one, and the plurality of first trench units are in contact with the carrier barrier region together.

3. The cell structure of a semiconductor device according to claim 1, wherein a plurality of carrier barrier regions are provided, and each of the plurality of first trench units is in contact with a corresponding carrier barrier region among the plurality of carrier barrier regions.

4. The cell structure of a semiconductor device according to claim 1, wherein the widths of the trench openings of the plurality of first trench units are equal to or different from each other; and the depths of the plurality of first trench units are equal to or different from each other.

5. The cell structure of a semiconductor device according to claim 1, wherein each side edge of the first source-body region contacts with the side edge of an adjacent first trench unit, and one side of the source regions contacts the first dielectric material and the second dielectric material contact the first metal layer, and covers all the trench openings of the plurality of first trench units, and contacts some or all of the source regions.

6. The cell structure of a semiconductor device according to claim 1, wherein the first conductivity type is P-type, and the second conductivity type is N-type.

7. The cell structure of a semiconductor device according to claim 1, wherein the first conductivity type is N-type, and the second conductivity type is P-type.

8. The cell structure of a semiconductor device according to claim 1, wherein the first semiconductor region is of the first conductivity type or the second conductivity type.

9. The cell structure of a semiconductor device according to claim 1, wherein a second semiconductor region of a conductivity type identical to or different from that of the first semiconductor region is arranged at one side of the first semiconductor region.

10. The cell structure of a semiconductor device according to claim 1, wherein a third semiconductor region of a conductivity type different from the conductivity type of the first semiconductor region is arranged at a side edge of the first semiconductor region on the same layer.

11. The cell structure of a semiconductor device according to claim 1, wherein the second source-body region is of the a-first conductivity type or the a-second conductivity type.

12. The cell structure of a semiconductor device according to claim 1, wherein the electric field shielding region and the carrier barrier region adjacent to each other either contact or do not contact each other.

13. The cell structure of a semiconductor device according to claim 1, further comprising:
a second electric field shielding region of the second conductivity type arranged in the semiconductor substrate;
a fourth metal layer arranged at the top of the semiconductor substrate; and
a semiconductor region of the second conductivity type formed in the semiconductor substrate in the vertical direction and in contact with the second electric field shielding region and the fourth metal layer.

* * * * *